United States Patent
Lin et al.

(10) Patent No.: US 7,103,867 B2
(45) Date of Patent: Sep. 5, 2006

(54) METHOD FOR MANUFACTURING A POWER BUS ON A CHIP

(75) Inventors: Chong Ming Lin, Sunnyvale, CA (US); Tatao Chuang, San Jose, CA (US); Tran Long, San Jose, CA (US); Hy Hoang, San Jose, CA (US)

(73) Assignee: Seiko Epson Corporation, Tokyo (JP)

( * ) Notice: Subject to any disclaimer, the term of this patent is extended or adjusted under 35 U.S.C. 154(b) by 97 days.

(21) Appl. No.: 10/973,896

(22) Filed: Oct. 27, 2004

(65) Prior Publication Data

US 2005/0086625 A1 Apr. 21, 2005

Related U.S. Application Data

(63) Continuation of application No. 10/077,940, filed on Feb. 20, 2002, now Pat. No. 6,842,885, which is a continuation of application No. 09/758,367, filed on Jan. 12, 2001, now Pat. No. 6,378,120, which is a continuation of application No. 09/270,738, filed on Mar. 16, 1999, now Pat. No. 6,233,721, which is a continuation of application No. 08/997,605, filed on Dec. 23, 1997, now Pat. No. 5,909,377, which is a continuation of application No. 08/665,846, filed on Jun. 19, 1996, now Pat. No. 5,726,904, which is a continuation of application No. 08/455,133, filed on May 31, 1995, now Pat. No. 5,561,789, which is a continuation of application No. 08/289,278, filed on Aug. 11, 1994, now Pat. No. 5,461,578, which is a continuation of application No. 07/833,419, filed on Feb. 10, 1992, now Pat. No. 5,345,394.

(51) Int. Cl.
G06F 17/50 (2006.01)

(52) U.S. Cl. .................... 716/12; 716/1; 716/2; 716/9; 716/17

(58) Field of Classification Search .................... 716/1, 716/2, 9, 12, 15, 17
See application file for complete search history.

(56) References Cited

U.S. PATENT DOCUMENTS

| | | | |
|---|---|---|---|
| 4,811,237 A | 3/1989 | Putatunda et al. |
| 4,816,692 A | 3/1989 | Rudert, Jr. |
| 4,835,705 A | 5/1989 | Fujino et al. |
| 4,849,847 A | 7/1989 | McIver et al. |
| 4,871,418 A | 10/1989 | Wittlinger et al. |
| 5,014,223 A | 5/1991 | Tanimori |
| 5,046,017 A | 9/1991 | Yuyama et al. |
| 5,047,949 A | 9/1991 | Yamaguchi |
| 5,166,867 A | 11/1992 | Seyama et al. |

(Continued)

*Primary Examiner*—Thuan Do
(74) *Attorney, Agent, or Firm*—Sterne Kessler Goldstein & Fox PLLC

(57) ABSTRACT

A method for manufacturing a power bus on a chip, where the power bus has slits generated therein. The present invention relates to a method to manufacture a power bus in which the reference to a layout data base shows the coordinate location of the power buses in the chip. A height and width for the power bus is calculated based on its coordinates. Based on the height and width of the power buses and the predetermined size and spacing between power slits, a number of power slits to be generated is determined. These power slits are then generated by adding the power slits to the power bus in the coordinates of the layout database. The method of the present invention also generates power slits for use in manufacturing power buses on a chip for cases in which the power buses overlap.

16 Claims, 10 Drawing Sheets

U.S. PATENT DOCUMENTS

| | | |
|---|---|---|
| 5,202,578 A | 4/1993 | Hideshima |
| 5,272,645 A | 12/1993 | Kawakami et al. |
| 5,298,787 A | 3/1994 | Bozler |
| 5,345,394 A | 9/1994 | Lin et al. |
| 5,404,310 A | 4/1995 | Mitsuhashi |
| 5,453,913 A | 9/1995 | Koyanagi |
| 5,461,578 A | 10/1995 | Lin et al. |
| 5,477,466 A | 12/1995 | Trkipathi et al. |
| 5,561,789 A | 10/1996 | Lin et al. |
| 5,666,497 A | 9/1997 | Milhaupt et al. |
| 5,686,356 A | 11/1997 | Jain et al. |
| 5,726,904 A | 3/1998 | Lin et al. |
| 6,023,569 A * | 2/2000 | Yun .......................... 716/15 |

* cited by examiner

METHOD FOR MANUFACTURING A POWER BUS ON A CHIP

CROSS-REFERENCE TO RELATED APPLICATIONS

This application is a continuation of application Ser. No. 10/077,940, filed Feb. 20, 2002 now U.S. Pat. No. 6,842,885, which is a continuation of application Ser. No. 09/758,367 filed Jan. 12, 2001 (now U.S. Pat. No. 6,378,120), issued Apr. 23, 2002, which is a continuation of application Ser. No. 09/270,738 filed Mar. 16, 1999 (now U.S. Pat. No. 6,233,721), issued May 15, 2001, which is a continuation of application Ser. No. 08/997,605 filed Dec. 23, 1997 (now U.S. Pat. No. 5,909,377), issued Jun. 1, 1999, which is a continuation of application Ser. No. 08/665,846 filed Jun. 19, 1996 (now U.S. Pat. No. 5,726,904), issued Mar. 10, 1998, which is a continuation of application Ser. No. 08/455,133, filed May 31, 1995 (now U.S. Pat. No. 5,561,789), issued Oct. 1, 1996, which is a continuation of application Ser. No. 08/289,278, filed Aug. 11, 1994 (now U.S. Pat. No. 5,461,578), issued Oct. 24, 1995, which is a continuation of application Ser. No. 07/833,419, filed Feb. 10, 1992, now U.S. Pat. No. 5,345,394, issued Sep. 6, 1994, all of which are incorporated herein by reference.

BACKGROUND OF THE INVENTION

1. Field of the Invention

The present invention relates generally to a method of manufacturing a power bus on a chip. In particular, the present invention relates to an automatic method of manufacturing a power bus having power slits generated therein, wherein the power bus is located on a chip and carries high current.

2. Related Art

A bus is a main conductor path of electricity in a circuit. Many devices are connected to a single bus and are solely dependent on this bus for power, timing and other related dependencies. For this reason, it is critical that buses function at all times, otherwise an entire chip may fail.

In today's ever increasing search for smaller and more powerful chips, buses are increasingly required to handle larger currents (high direct current or high pulse and alternating current). Such high currents cause a number of related problems, which lead to bus failure. These problems include: stress and sub-layer gaseous release.

Stress is caused by the mechanical deformation of the bus from processing time and subsequent high temperature steps as a result of increased current at operation time. Most buses are comprised of a metal which is typically aluminum or an alloy of aluminum. Increased currents generate increased electron bombardment on atoms and lattice movement along the metal grain boundary of a bus. This in turn generates heat. The heat produces thermal expansion of the metal bus, and as a consequence, the structure of the metal bus may significantly change or eventually melt depending on the amount of current passing through the bus.

The properties of the semiconducting substrate are significantly more stable to heat due to large volume material structure able to dissipate and absorb the heat. Therefore, a semiconductor substrate will not expand or contract at the same rate as metal buses. This phenomenon causes forces to build between the semiconductor substrate (or isolation layers between metal layers, due to different thermal expansion coefficients) and the metal bus when currents pass through the bus, resulting in significant stresses and strains. Consequently, a metal bus will "buckle" or separate as a result of tensile and shear stresses caused by thermal expansion.

When metal layers are formed during manufacturing stages, gases are trapped between the metal and the semiconductor substrate. This gas can affect chemical states of devices causing undesired electrical property changes and reliability problems at a later period in time.

In order to solve the problem of stress and trapped gases, chip designers have recently begun to manually open slits in buses on a circuit chip during layout time or using other means. Openings normally occur on wider buses, because wider buses are more susceptible to stress and trapped gas problems.

FIG. 1 illustrates power buses 102 with slits 104 formed therein. The slits are referred to in this field as power slits. Power slits 104 act as a means for enabling expansion and contraction of metal power buses 102. Power slits 104 also enable gases to be released more easily from underneath power buses 102 during processing time.

Power slits 104 are opened according to current flow direction. Normally, current flow runs in a length-wise direction of a power bus 102. However, it is difficult to determine current flow 108 due to various corner cases 106 and non-orthogonal cases 110. A corner case is where two or more buses intersect. It is important not to block current flow, as shown in bus 112. This is one reason power slits 104 are manually entered in the mask database.

Nevertheless, a significant problem occurs at corner cases 106 from current flow being confined to a narrow path (also labelled as 108). As more and more current develops at a specific path 108 electro-migration occurs. Electro-migration is an undesirable result produced from too much electric current being confined to a specified area of bus 102. In this example, electro-migration is more likely to occur at a corner case 106, because electro-migration is limited to flow between power slits 104 and a boundary 114 of the aluminum power bus 102.

FIG. 2 illustrates a magnified granular view of aluminum metal at a corner case 106. FIG. 2 includes grains 202 and a bi-directional arrow path 108 indicating current flow.

Another common problem, referring back to FIG. 1, occurs with manually entering slits 104. The layout engineer examines all the buses on the chip via a computer terminal, and manually inserts all the power slits. The labor costs and time involved are currently exorbitant, not to mention error generation and verification time. With the fabrication of very large scale integrated devices, typically a chip containing one million transistors or more, requires approximately one week of time to layout power slits 104 correctly for corresponding buses 102. Furthermore, ultra large scale integrated devices typically having over ten million transistors, typically require more than one week to layout power slits 104 for corresponding buses 102.

SUMMARY OF THE INVENTION

The present invention is directed to an automatic method of generating slits in power buses. The present invention includes three embodiments. The first embodiment is directed to a generic method of generating power slits in buses. This is accomplished by identifying the dimensions of buses. Once bus dimensions are identified, predetermined parameters for optimal power slit size and number are used to automatically generate a power slit layer for the mask database. This process is extremely fast with generation time taking a matter of seconds as opposed to weeks, with error-free result.

The second embodiment is a continuation of the first embodiment and is directed to a method for handling an orthogonal corner case (where two buses cross at 90 degree angles). The second embodiment of the present invention locates all orthogonal corner cases. The power slits are removed within the cross (corner/intersect) area of the two buses. At this point power slits from the overlapping buses are extended across the corner/intersect area. The extension lines are logically ANDed together resulting in points within the corner/intersect area where the extension lines intersect. These intersection points indicate where new types of power slits, called "holes", can be generated. No manual layout of power slits is required at corner cases, when the present invention is used.

The third embodiment is directed to a method of generating power slits for non-orthogonal buses. The same method for handling an orthogonal corner case is used for power buses crossing at non-orthogonal angles. Predetermined coordinates are used to locate where buses cross one another. The power slits are removed within the cross (corner/intersect) area of the two buses. At this point power slits from the overlapping buses are extended across the corner/intersect area. The extension lines are made in orthogonal fashion, by following the orthogonal direction (vertical and horizontal) as if the buses crossed at 90° angles (as in the second embodiment). The extension lines are then logically ANDed together resulting in points within the corner/intersect area where the extension lines intersect. These intersection points indicate where "holes", can be generated.

Further features and advantages of the present invention, as well as the structure and operation of various embodiments of the present invention, are described in detail below with reference to the accompanying drawings.

BRIEF DESCRIPTION OF THE FIGURES

The present invention will be described with reference to the accompanying drawings, wherein.

In the drawings, like reference numbers indicate identical or functionally similar elements. Additionally, the left-most digit of a reference number identifies the drawing in which the reference number first appears.

The above mentioned drawings are illustrated for purposes of example. One skilled in the art should understand that these drawings are not drawn to scale and it should also be understood that power slits illustrated in the above mentioned figures represent openings in metal buses.

DETAILED DESCRIPTION OF THE PREFERRED EMBODIMENTS

1. Overview

The present invention is directed to an automatic method of generating slits in power buses. The present invention includes three embodiments. The first embodiment is directed to a generic method of generating power slits. The second embodiment is a continuation of the first embodiment and is directed to a method of generating power slits for an orthogonal corner case. The third embodiment is directed to a method of generating power slits for non-orthogonal corner case. The aforementioned embodiments are discussed in the following sections.

2. Generating Power Slits in Power Buses

Figure 3:
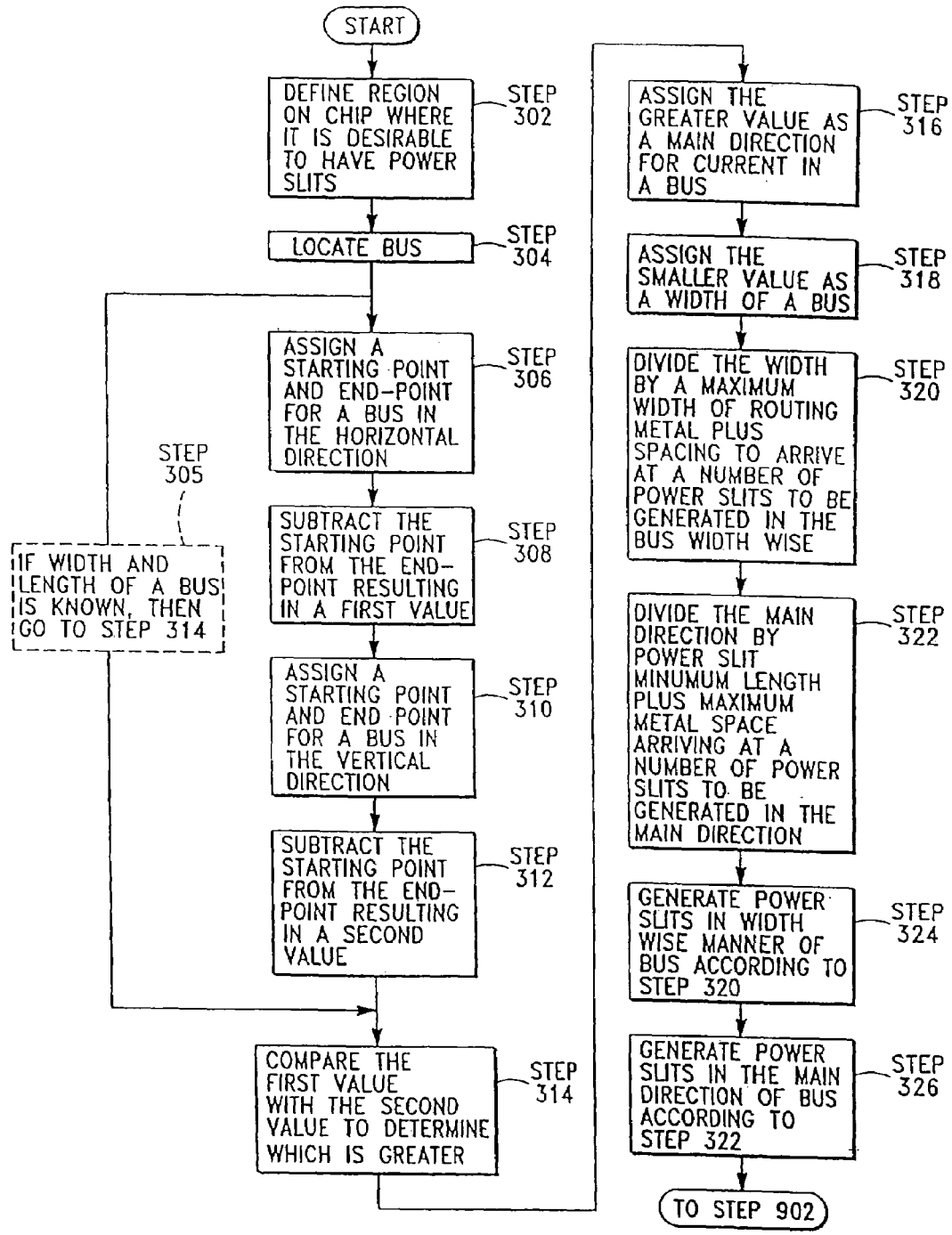
FIG. 3 is a flow chart illustrating the representative steps that occur according to a first embodiment of the present invention.

FIG. 3 is a flow chart illustrating the representative steps that occur according to a first embodiment of the present invention. In the preferred embodiment the mask, or layout database is in standard CALMA GDS II binary format. However, the present invention may operate with any layout database containing coordinate locations of buses on a chip. Additionally, the present invention can operate independently on any operating system of a computer. Steps 301–326 are generally demonstrated by referring to FIGS. 4 and 5.

Figure 4:
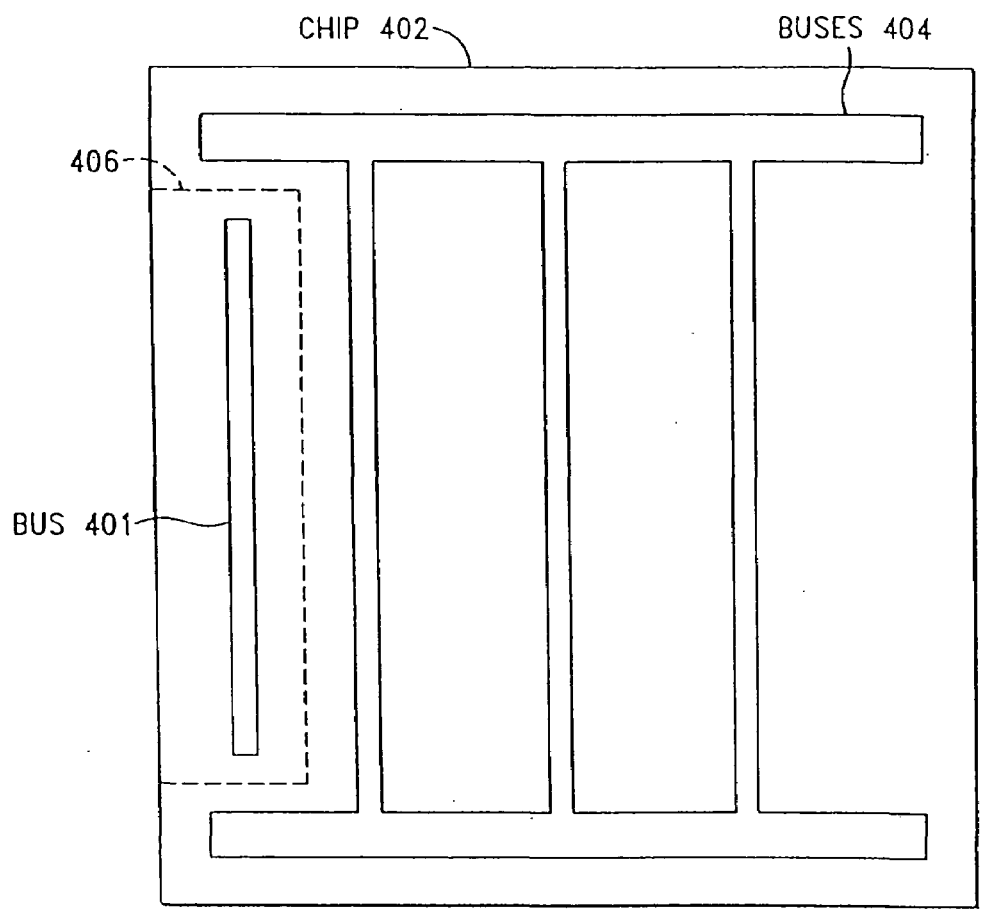
FIG. 4 illustrates a generalized high level diagram of a chip 402.
Figure 2:
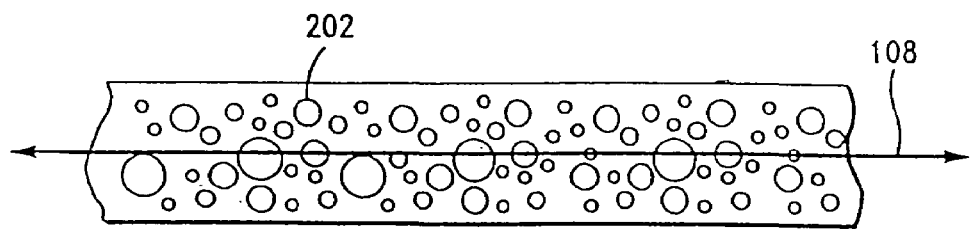
FIG. 2 illustrates a magnified granular view of aluminum metal at a corner case.

FIG. 4 illustrates a generalized high level diagram of a chip 402. Chip 402 includes buses 404. Buses 404 are generally, straight line buses in horizontal and vertical directions. Buses 404 in the preferred embodiment are power buses, and are typically composed of aluminum or an alloy of aluminum. However, the buses may be any type of material in which it is desirable to incorporate power slits. In addition, the buses may carry direct current, pulse current or alternating current depending on their particular application.

Figure 5:
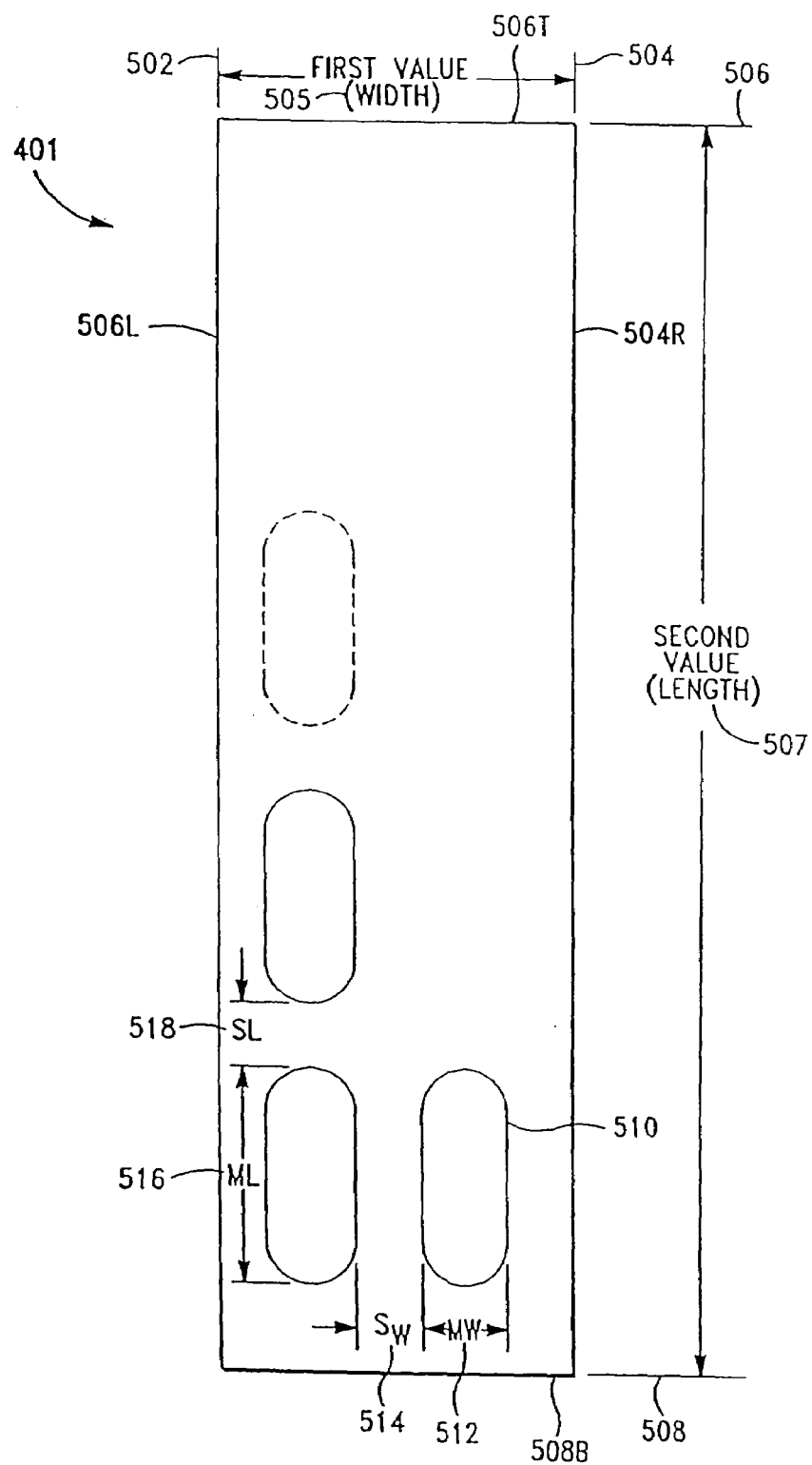
FIG. 5 illustrates a magnified defined area of a bus indicated by dotted lines located in FIG. 4.

FIG. 5 illustrates a magnified defined area 406 of a bus 401 indicated by dotted lines located in FIG. 4. FIG. 5 includes an enlarged bus 401 and power slits 510.

In FIG. 3, steps 301–316 ascertain the width and length of buses. Steps 318–326 ascertain and generate a number of power slits 510 based on the results of steps 301–316. The operation of the present invention will now be described in greater detail.

As shown in FIG. 4, in a step 302, a user of the present invention can define a region 406 of chip 402 where it is desirable to have power slits. A user will generally confine the operation of the present invention by setting parameters of a data base indicating coordinate value location. The coordinate values can then be used as the defining parameter for step 302. In a step 304, according to the database used, power buses 404 are located in defined region 406 of chip 402. Power bus 401 is the only bus in region 406.

In an optional step 305, represented by dashed lines, the method can also search chip 402 for buses wide enough to contain power slits 510. However, the width and length of buses 404 must already be known. If they are known then the operational steps 306–312 may be skipped or steps 306–312 can be performed with step 305 starting after step 312.

Referring to FIG. 5, in a step 306, a first value 505 of the bus 401 is determined in the horizontal direction (i.e., X-axis). First value 505 of bus 401 is the width of bus 401. However, at this point in the flow chart of FIG. 3, it is impossible to know if this is the width or length of bus 401, since bus 401 may have extended in the horizontal direction instead of the vertical direction, (i.e., Y-axis). A starting point 502 and an end point 504, representing a bus boundary 502L and 502R, respectively, are assigned in the horizontal direction starting from left-to-right for bus 401. Assigning of starting point 502 and end point 504 could easily be reversed starting from right-to-left. Typically, a database will contain coordinate values for all elements located on chip 402. Therefore, starting point 502 and end point 504 will have a coordinate value indicating a location on chip 402. Thus, the issue of which direction is the width or length can be predetermined.

In a step 308, starting point 502 is subtracted from end point 504 resulting in an absolute first value 505. Absolute values are utilized because it is important that only positive numbers are employed to represent distances. At this point in the method, first value 505 either represents the width or length of bus 401 as explained above.

In a step 310, a starting point 506 and an endpoint 508 are assigned to corresponding opposite boundaries of bus 401 in the vertical direction. In other words, starting point 506 is assigned to a top boundary 506T of bus 401 and endpoint 508 is assigned to a bottom boundary 508B. Assignment of starting point 506 and end point 508 could easily be reversed going from bottom-to-top.

In a step 312, starting point 506 is subtracted from endpoint 508 resulting in a second value 507. Second value 507 represents a distance of bus 401 in the vertical direction. As in step 508, absolute values are utilized because it is important that only positive numbers are employed to represent distances. At this point in the method, second value 507 either represents the width or length of bus 401, as explained above.

In a step 314, first value 505 is compared with second value 507 to determine which is greater. In this example, second value 507 is greater than first value 505 (Second Value>First Value). Therefore, in a step 316, the greater value (second value 507) is assigned as a main direction for current flow in power bus 401.

In a step 318, first value 305 (the smaller value) is assigned as the width of bus 401. Thus, first value 505 and second value 507 now represent the width and length of bus 401, respectively, as a result of steps 302–318.

In accordance with steps 302–318, steps 320–326 determine how many power slits 510 are to be generated in the main direction (lengthwise) and the width-wise direction for bus 401.

The maximum width 512 of a power slit 510 is a predetermined parameter set by a user. Additionally, the amount of space (Sw) 514 between each power slit 510 is also predetermined by a user as a function of proper electron flow and photolithography. A minimum length 516 of a power slit 510 is predetermined by a user for optimal electron flow on the same basis.

Accordingly, in a step 320, width 505 of bus 401 is divided by the maximum width 512 of power slit 510 plus spacing 514 between power slits 510. As a result of this division step, the number of power slits to be generated in the horizontal direction (width 505) of bus 401 is determined.

In a step 322, second value (main direction of current flow) 507 is divided by power slit's 510 minimum length 516 plus the maximum minimal space 518 between power slits 510 in the lengthwise or main direction. As a result of the division step, the number of power slits 510 to be generated in the main direction (vertical direction) of bus 401 is determined.

In a step 324, the method generates power slits 510 in a horizontal direction according to step 320. Likewise, in a step 326, the present invention generates power slits 510 in the main direction of bus 401 according to step 122. Generation steps, 322–324, are pre-etching steps indicating a location for the etching of power slits to take place during an etching process.

3. Dealing with the Corner Case (Buses Overlapping Orthogonally)

Figure 6:
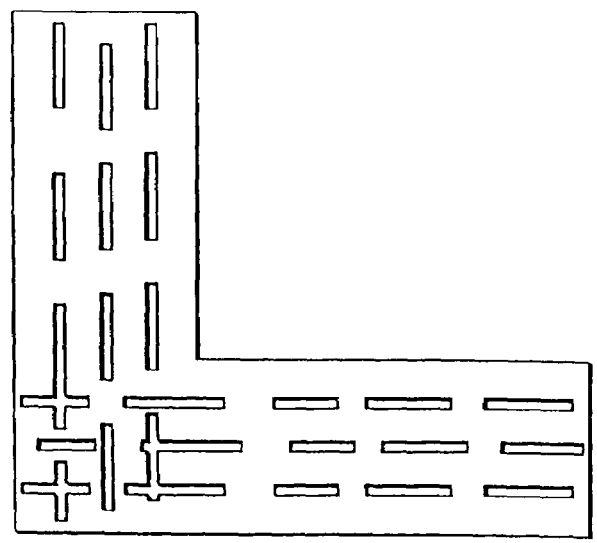
FIG. 6 illustrates an L-shaped corner case.
Figure 7:
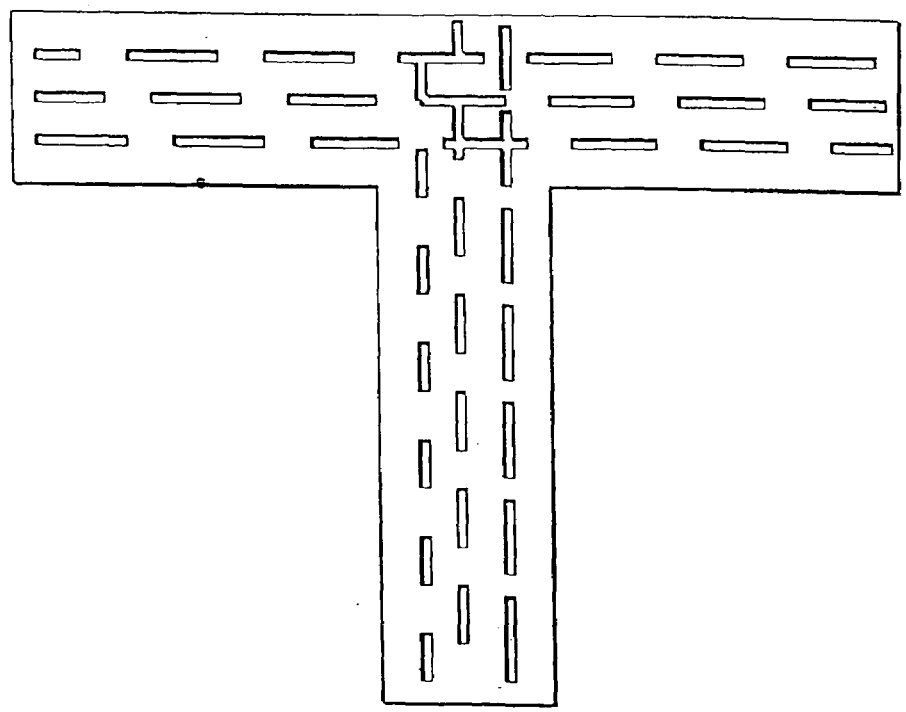
FIG. 7 illustrates a T-shaped corner case.
Figure 8:
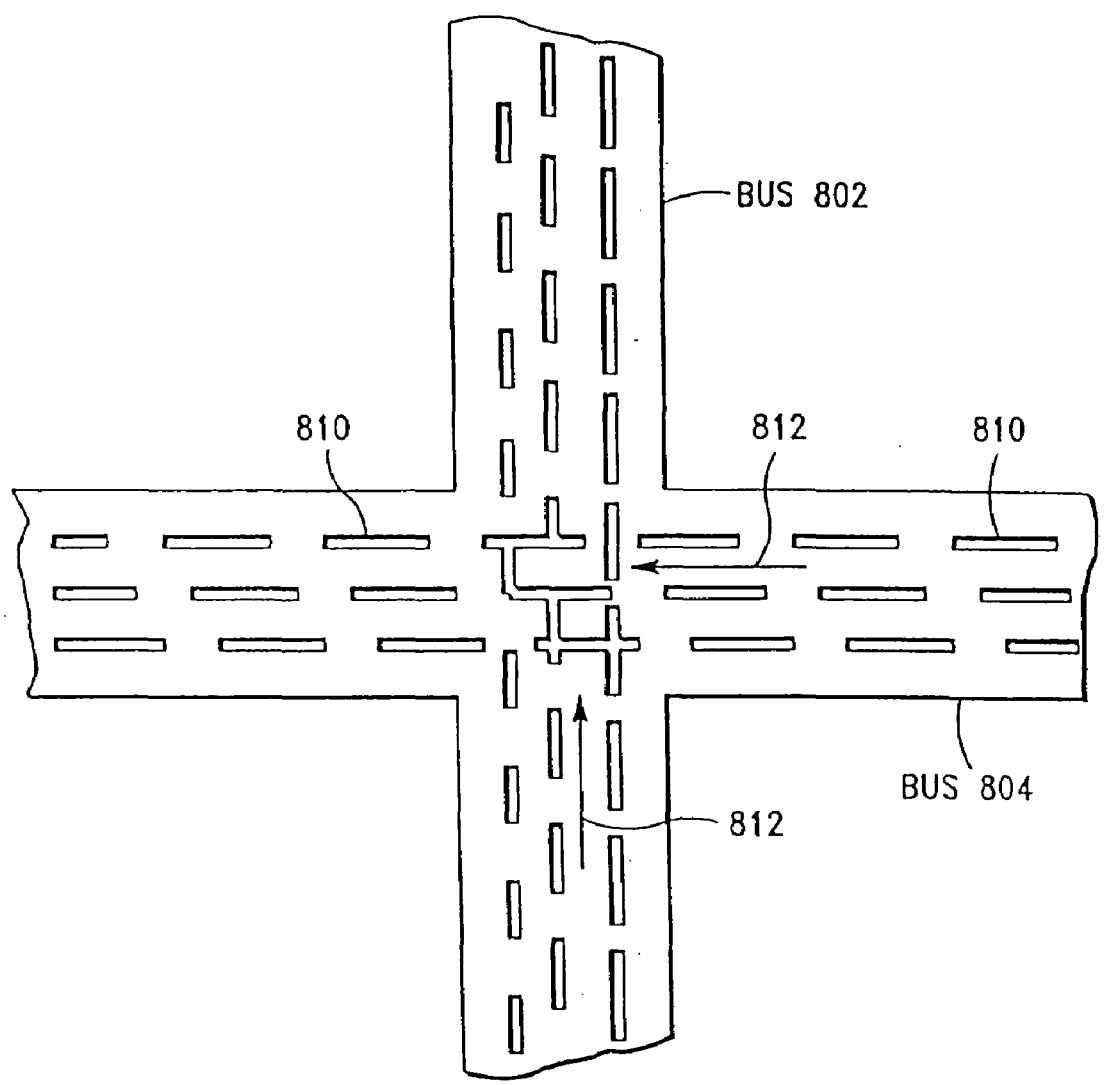
FIG. 8 illustrates a cross shaped corner case.

Power slits generated according to the method described in Section 2 are shown in FIGS. 6–8. FIGS. 6–8 represent three possible orthogonal corner cases: FIG. 6 illustrates an L-shaped corner case; FIG. 7 illustrates a T-shaped corner case; and FIG. 8 illustrates a cross shaped corner case. An orthogonal corner case occurs when two or more buses intersect at 90° angles.

Figure 9:
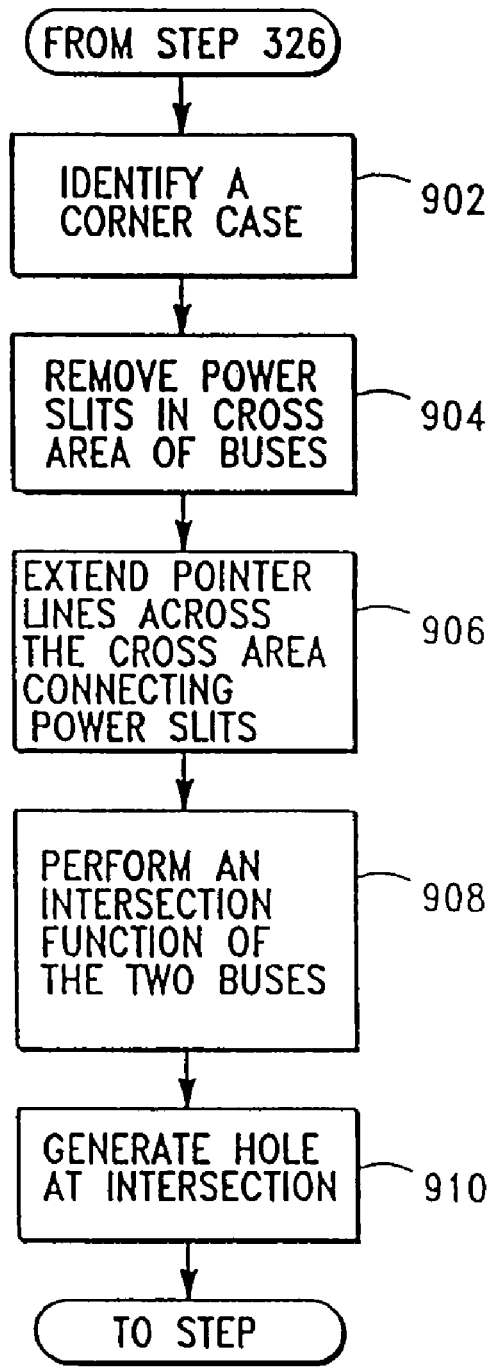
FIG. 9 is a flow chart illustrating the representative steps that occur according to a second embodiment of the present invention.

FIG. 9 is a flow chart illustrating the representative steps that occur according to a second embodiment of the present invention. FIG. 9 is a continuation of FIG. 3. FIG. 9 will be described with reference to the cross corner case of FIGS. 8, 10, 11, 12 and 13. However, the method described in FIG. 9 can easily be applied to either the L or T-shaped corner cases shown in FIGS. 6 and 7.

FIG. 8 shows a cross shaped corner case with buses 802 and 804 containing power slits 810 generated according to the first embodiment. Where bus 802 crosses bus 804, power slits 810 effectively are now set-up to block current flow 812. Therefore, it is necessary to identify corner cases to resolve the problem of power slits 810 blocking current flow 812.

Referring to FIG. 9, in a step 902 a corner case is identified by searching for points where two buses share identical coordinate values. This is an indication that at least two buses form a corner case.

Figure 10:
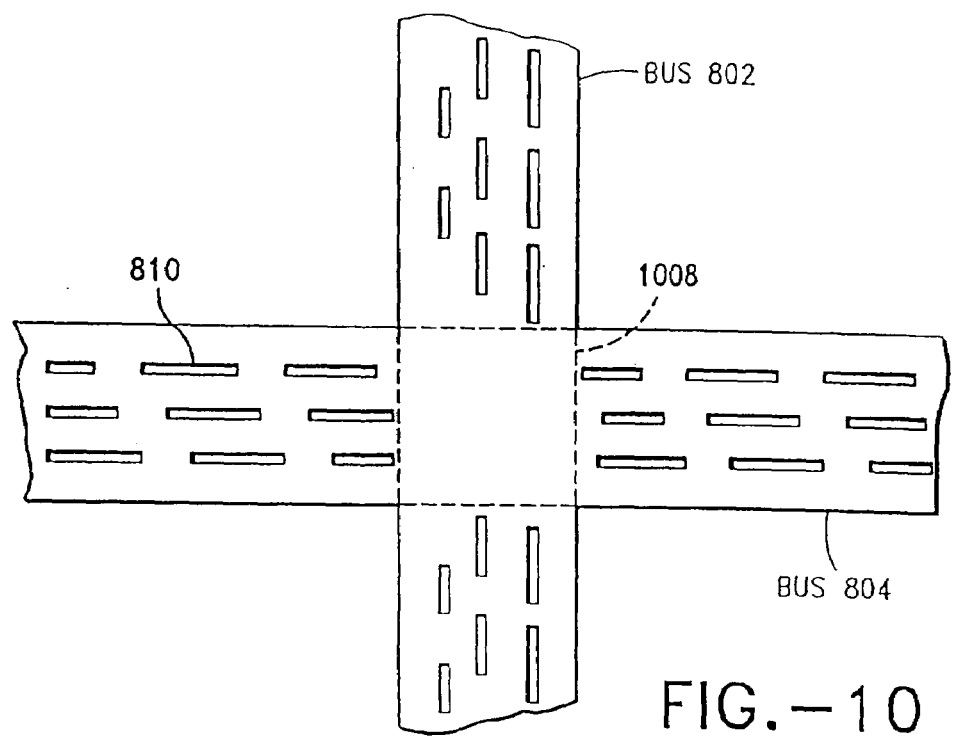
FIG. 10 illustrates the removal of power slits from a corner/intersect area where two buses intersect.

As shown in FIG. 10, coordinate points 1020, 1022, 1024 and 1026 indicate where two buses 802, 804 overlap in the X and Y direction. Accordingly, coordinate points 1020–26 define the cross area where buses 802 and 804 overlap. This cross area, which is represented by dotted lines is known as a "corner/intersect" area 1008. Coordinate points 1020–26, the boundaries of corner/intersect area 1008, will be referred to as corner points hereinafter.

In a step 904, power slits 810 are removed only within the corner/intersect area 1008. FIG. 10 illustrates the removal of power slits from the area where bus 802 and 804 intersect; corner/intersect area 1008. Removal of power slits 810 in corner/intersect area 1008 is accomplished by logically negating all power slits 810 defined by the corner points 1020–26. One skilled in the art should understand that power slits 810 can be removed from corner/intersect area 1008 by other methods.

Figure 11:
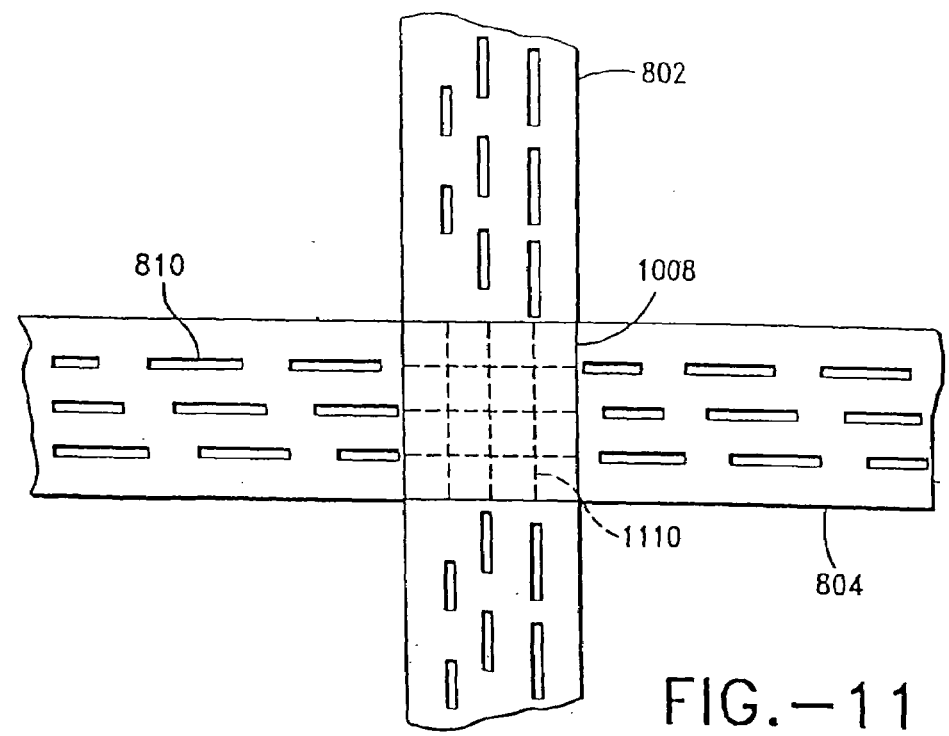
FIG. 11 illustrates a corner/intersect area with pointer lines extending from power slits according to FIG. 9.

At this point, all power slits 810 are removed from corner/intersect area 1008. However, if no power slits 810 are etched in corner/intersect area 1008, the same problems discussed above (stress and sub-layer gaseous releases mentioned above) will occur. Therefore, it is desirable to generate a type of power slit 810 that does not block electron flow. Generation of this new type of power slit is described in steps 906–910 with reference to FIG. 11. FIG. 11 illustrates a corner/intersect area with pointer lines extending from power slits, according to FIG. 9.

Referring to FIG. 11, in a step 906 pointer lines 1110, shown as dashed lines, are extended from power slits 810 of bus 802 across the corner/intersect area 1008 (now represented by a solid line so as not to confuse this representative area with the dashed pointer lines) to join complimentary opposed power slits 810 (mirror images) of the same bus 802. Likewise power slits 810 of bus 804 are joined in the same fashion by pointer lines 1110. In essence, these pointer lines 1110 act as extensions of power slits 810.

In a step 908, the present invention performs an intersection function of bus 802 with bus 804 (802∩804). This is equivalent to logically ANDing slits 810 of bus 802 with slits 810 of bus 804 which intersect. This is also equivalent to logically ORing the metal portion of bus 802 with the pointer lines belonging to bus 804 or logically ORing the metal portion of bus 804 with the pointer lines belonging to bus 802 and many similar combinations of logically ANDing and ORing as one skilled in the art understands. The step of logically ANDing slits 810 of bus 802 with slits 810 of bus 804 is the preferred embodiment.

Figure 12:
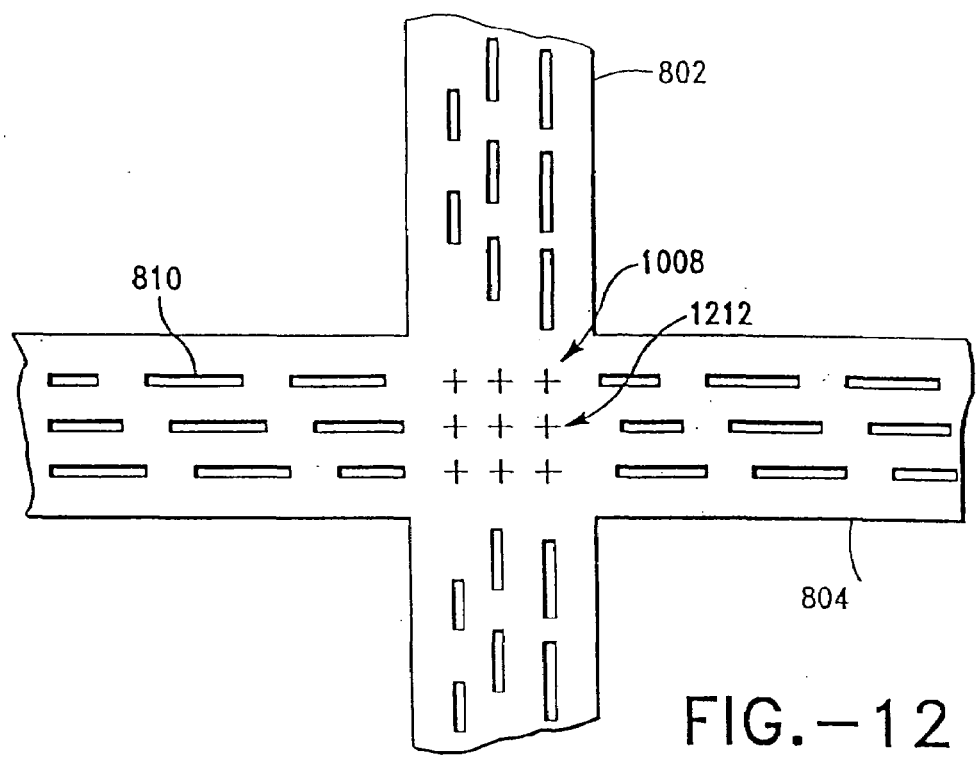
FIG. 12 illustrates a representative example of a corner/intersect area after two buses are functionally intersected according to the second embodiment.

FIG. 12 illustrates a representative example of a cross/intersection area 1008 after two buses 802 and 804 are functionally intersected. As a result of step 908, little plus symbols (+) 1212 indicate where to generate a hole in the metal of buses 802 and 804. In a step 910, the holes are generated in the buses at cross/intersection area 1008.

Figure 1:
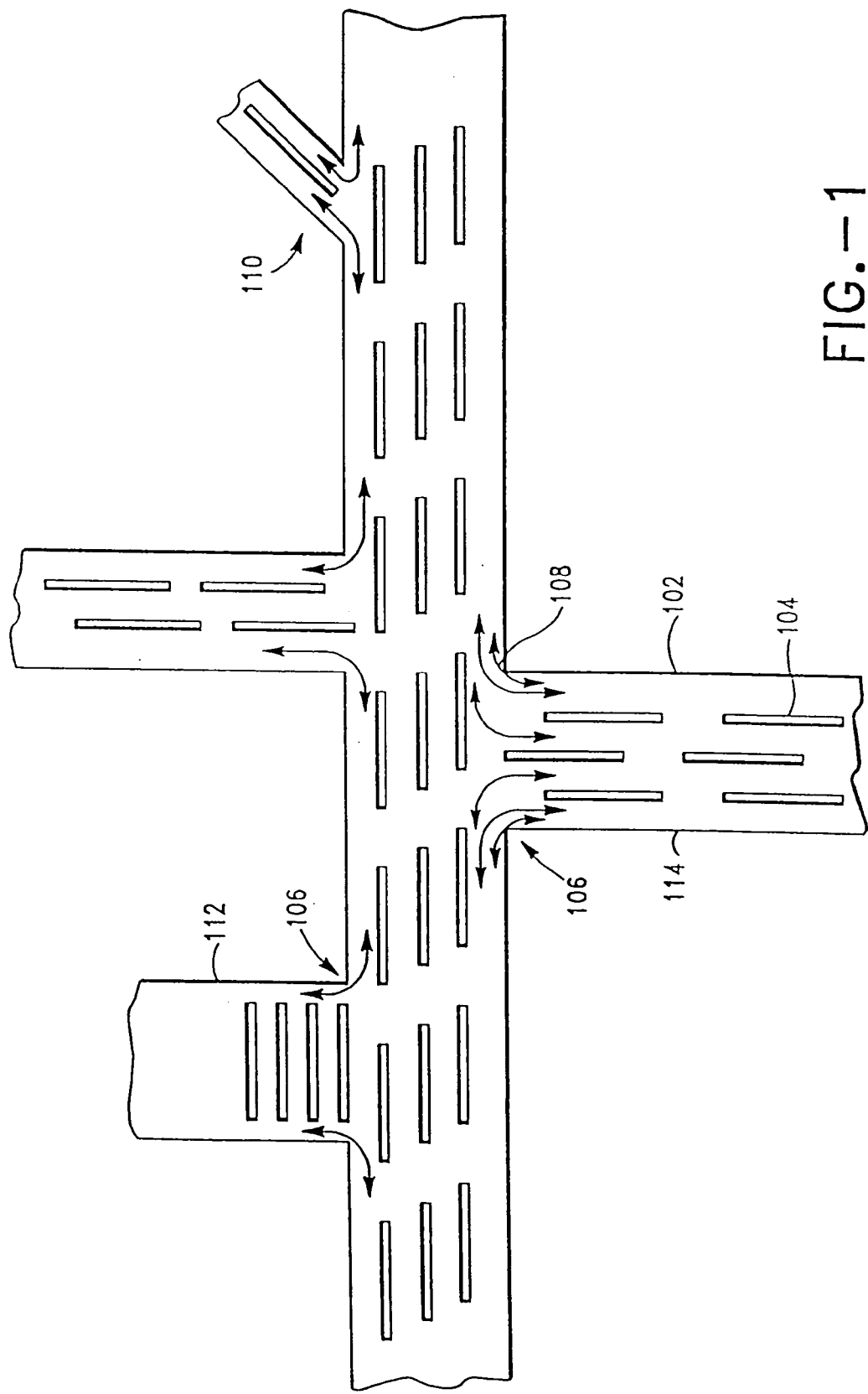
FIG. 1 illustrates power buses with manually formed power slits improperly formed.
Figure 13:
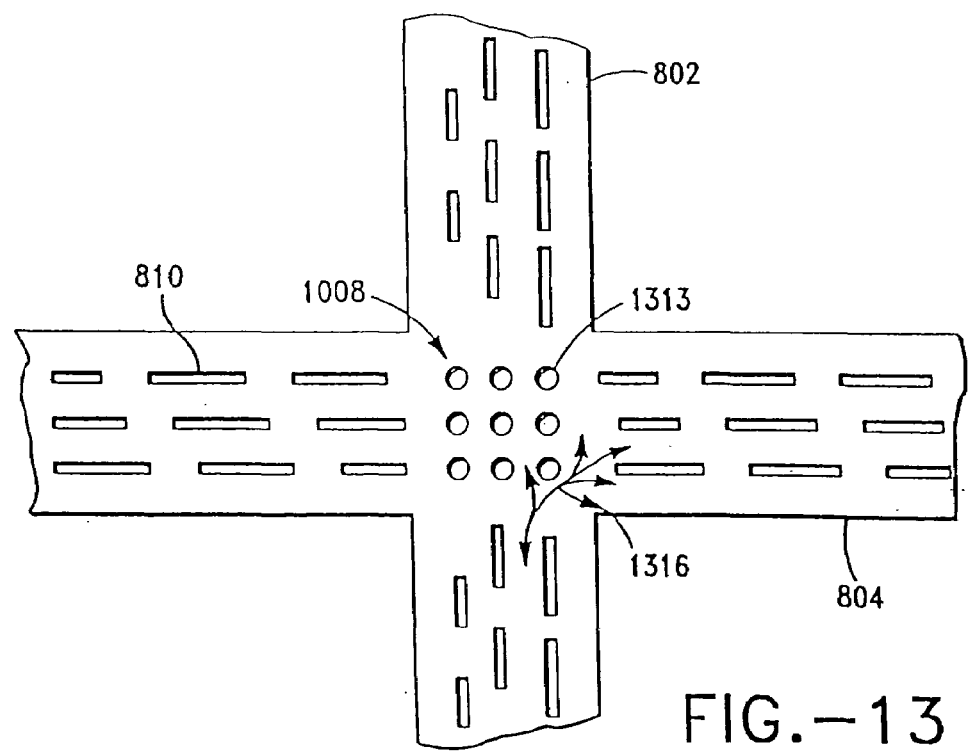
FIG. 13 illustrates holes located in a corner/intersection area of two buses according to plus symbols generated according to the second embodiment of the present invention.

FIG. 13 illustrates holes 1313 located in cross/intersection area 1008 of buses 802 and 804 according to plus symbols 1212 generated in step 908. In the preferred embodiment, the holes are aligned at the intersection points of buses 802 and 804 (determined in step 908). Additionally, the shapes of the holes in the preferred embodiment are elliptical, however, they may be of any desired shape presently understood or contemplated in the future. FIG. 13 shows current flow 1316 is not limited to one path as was the case in FIG. 1. This significantly reduces the chances of electro-migration and earlier discussed problems of stress and gas release (if left with no holes 1313 as shown in FIG. 10).

4. Generating Power Slits for Non-Orthogonal Overlaid Buses

Non-orthogonal cases are rare in VLSI layout systems. In most production environments, power buses generally cross one another at 90° angles more than 99% of the time. The rest of the time power buses cross one another at 45° angles to adjust for very uncommon layout restrictions. It is extremely rare that power buses will cross one another at an angle other than 90° or 45°. Regardless of the angle that power buses cross one another, the same method described above for orthogonal corner cases is used to generate power slits in power buses crossing at non-orthogonal angles.

Figure 14:
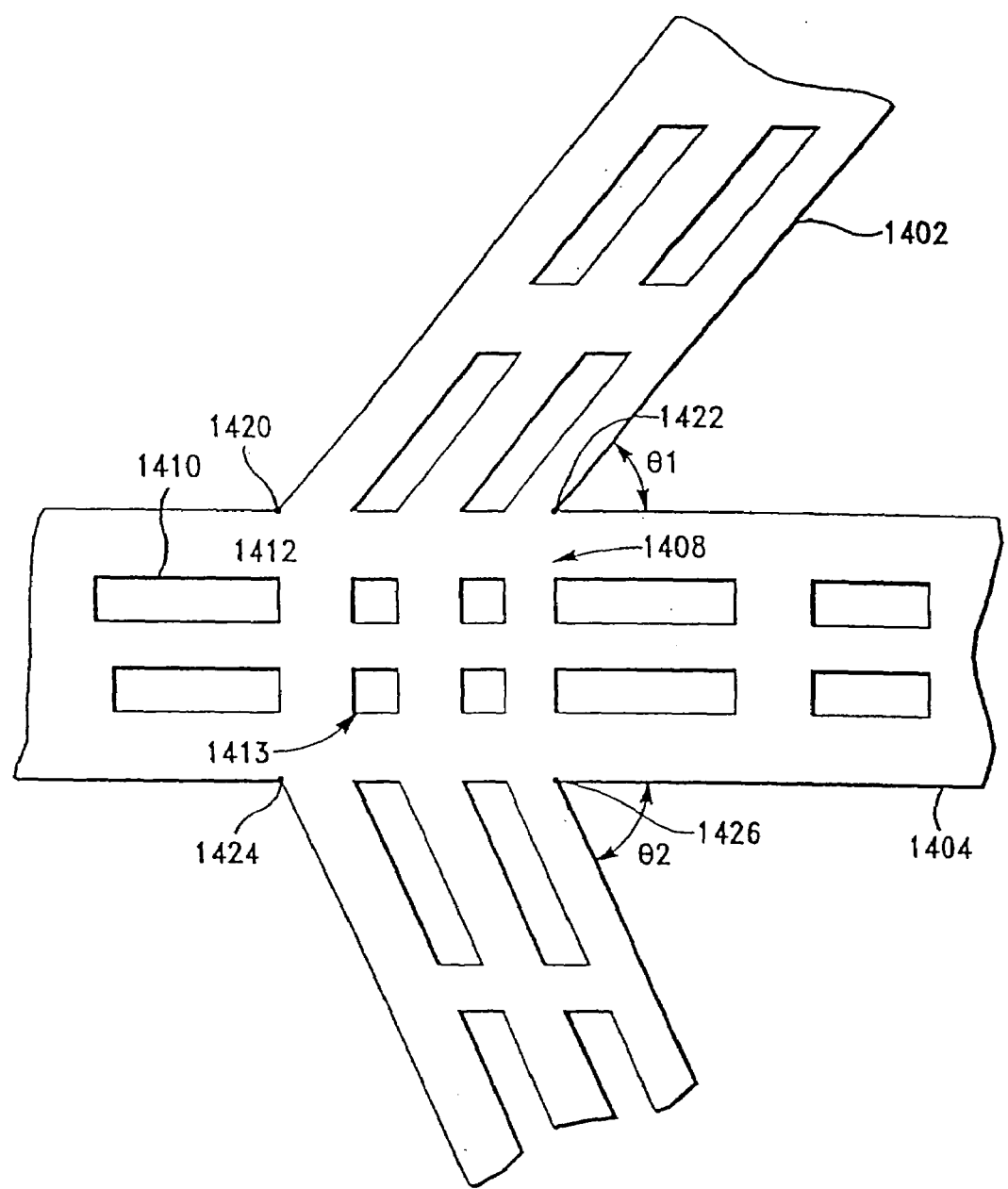
FIG. 14 illustrates holes generated in buses crossing at non-orthogonal angles according to a third embodiment of the present invention.

FIG. 14 illustrates two power buses crossing non-orthogonal angles. FIG. 14 includes power buses 1402, 1404, a corner/intersect area 1408, and power slits 1410. Power bus 1404 forms angles θ1, θ2 with power bus 1402, where θ1 and θ2 can be any angle. Power slits 1410 were generated in accordance with the first embodiment described above.

Referring now to FIG. 9, in step 902 a corner case 1408 is identified by searching for points where two buses have intersecting coordinates. Coordinate points 1420–26 indicate where corner/intersect area 1408 is located.

Power slits 1410 are removed only within the areas where buses 1402 and 1404 intersect; "corner/intersect" area 1408. Removal of power slits 1410 in corner/intersect area 1408 is accomplished by logically negating all power slits 1410 located within corner/intersect area 1408 as defined by coordinate points 1420–26.

According to FIG. 9 in step 906 pointer lines 1412, shown as dashed lines, are extended from power slits 1410 of bus 1402 across the corner/intersect area 1408 to join complimentary opposed power slits 1410 (mirror images) of the same bus 1402. Likewise power slits 1410 of bus 1404 are joined in the same fashion by pointer lines. 1412. Pointer lines 1412 from power slits 1410 of power bus 1404 are extended in a vertical direction of 90° to join complimentary opposed power slits 1410. In general pointer lines are either extended in the vertical (90°) direction as in this example or in the horizontal (180°) direction (i.e., when joining power slits 1410). These pointer lines 1412, in essence act as extensions of power slits 1410.

In step 908, the present invention performs an intersection function of bus 1402 with bus 1404 (1402∩1404). This is equivalent to logically ANDing slits 1410 of bus 1402 with slits 1410 of bus 1404 which intersect.

As a result of step 908, squares 1413 indicate where to generate a hole in the metal of buses 1402 and 1404. In step 910, the holes are generated in the buses at cross/intersection area 1408. As described above the holes may be opened in the metal power buses in any desired shape.

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

The invention claimed is:

1. A computer program product for defining power slits in a power bus located on a chip, comprising:
    a computer usable medium having computer readable program code means embodied in said computer usable medium for causing an application program to execute on an operating system of a computer, said computer readable program code means comprising:
    a computer readable first program code means for locating the power bus in a defined region of the chip;
    a computer readable second program code means for determining a first number of power slits to be generated in a horizontal direction of the power bus;
    a computer readable third program code means for determining a second number of power slits to be generated in a vertical direction of the power bus; and
    a computer readable fourth program code means for defining the power slits in the horizontal and vertical directions of the power bus according to said first and second numbers of power slits calculated by the second program code means and the third program code means, respectively.

2. The computer program product of claim 1, further comprising:

a computer readable fifth program code means for determining a width for the power bus; and a computer readable sixth program code means for determining a length for the power bus;

wherein said second program code means includes means for dividing the width of the power bus by a predetermined maximum width of the power slits plus a predetermined first spacing distance between the power slits to determine the first number of power slits to be generated in a horizontal direction of the power bus; and wherein said third program code means includes means for dividing the length of the power bus by a predetermined minimum length of the power slits plus a predetermined second spacing distance between the power slits in the lengthwise direction to determine a second number of power slits to be generated in a vertical direction of the power bus.

3. The computer program product of claim 2, wherein said fifth and sixth program code means comprise:

means for assigning a first starting-point and a first endpoint corresponding to boundaries of the power bus in a horizontal direction;

means for subtracting the first starting-point from the first endpoint resulting in a first absolute value;

means for assigning a second starting-point and a second endpoint corresponding to boundaries of the power bus in a vertical direction;

means for subtracting the second starting-point and the second endpoint resulting in a second absolute value;

means for comparing the first absolute value with the second absolute value to determine which is greater;

means for assigning the greater value as the length of the power bus; and means for assigning the lesser value as the width of the power bus.

4. The computer program product of claim 3, further comprising:

a computer readable seventh program code means for receiving parameters indicating coordinate value locations for the chip;

wherein the first and second starting-points and the first and second endpoints are coordinate locations obtained from the coordinate values received by the seventh program code means.

5. The computer program product of claim 2, further comprising:

a computer readable seventh program code means for comparing the width for the power bus determined by the fifth program code means to a minimum standard value and invoking the first program code means if the minimum standard value is greater than the width for the power bus.

6. A computer program product for defining power slits in a power bus, comprising:

a computer usable medium having computer readable program code means embodied in said computer usable medium for causing an application program to execute on an operating system of a computer, said computer readable program code means comprising:

a computer readable first program code means for locating a power bus in a defined region of a chip;

a computer readable second program code means for determining a first number of power slits to be generated in a horizontal direction of the power bus;

a computer readable third program code means for determining a second number of power slits to be generated in a vertical direction of the power bus;

a computer readable fourth program code means for defining the power slits in the horizontal and vertical directions of the power bus according to said first and second numbers of power slits calculated by the second program code means and the third program code means, respectively; and a computer readable fifth program code means for invoking the first, second, third and fourth program code means until all power buses in the defined region have power slits.

7. The computer program product of claim 6, further comprising:

a computer readable sixth program code means for determining a width for the power bus; and a computer readable seventh program code means for determining a length for the power bus;

wherein the second program code means includes means for dividing the width of the power bus by a predetermined maximum width of the power slits plus a predetermined first spacing distance between the power slits to determine the first number of power slits to be generated in a horizontal direction of the power bus; and wherein said third program code means includes means for dividing the length of the power bus by a predetermined minimum length of the power slits plus a predetermined second spacing distance between the power slits in the lengthwise direction to determine a second number of power slits to be generated in a vertical direction of the power bus.

8. The computer program product of claim 6, further comprising:

a computer readable sixth program code means for identifying if any power buses in the defined region overlap to form an orthogonal cross section;

a computer readable seventh program code means for removing all power slits in the orthogonal cross section;

a computer readable eighth program code means for extending first pointer line(s) from a first power slit(s) of a first power bus to an opposite boundary side of the cross section to connect the first power slits(s) of the first power bus;

a computer readable ninth program code means for extending second pointer line(s) from a second power slit(s) of a second power bus to an opposite boundary side of the cross section from the second power slits of the second power bus;

a computer readable tenth program code means for intersecting, logically, the first pointer line(s) with said second pointer line(s) forming a defined hole indicating where to generate power slits.

9. The computer program product of claim 8, wherein said tenth program code means comprises means for logically ANDing the first pointer line(s) with the second pointer line(s) to form defined holes indicating where to generate power slits.

10. The computer program product of claim 9, wherein said sixth program code means comprises means for evaluating logically where two buses share coordinate values that intersect.

11. The computer program product of claim 10, wherein said means for evaluating includes means for searching for two buses that have overlapping coordinate values.

12. The computer program product of claim 8, wherein said eighth program code means includes means for extending pointer lines in a 90° direction.

13. The computer program product of claim 8, wherein said eighth program code means includes means for extending pointer lines in a 180° direction.

14. The computer program product of claim 8, wherein said ninth program code means includes means for extending pointer lines in a 90° direction.

15. The computer program product of claim 8, wherein said ninth program code means includes means for extending pointer lines in a 180° direction.

16. A computer program product for defining slits in a power bus located on a chip, comprising:

a computer usable medium having computer readable program code means embodied in said computer usable medium for causing an application program to execute on an operating system of a computer, said computer readable program code means comprising:

a computer readable first program code means for determining a number of power slits to be generated in the power bus; and a computer readable second program code means for defining the power slits in the power bus according to the number of power slits calculated by the first program code means.

* * * * *